United States Patent
Fay et al.

(10) Patent No.: US 8,492,242 B2
(45) Date of Patent: Jul. 23, 2013

(54) DRY FLUX BONDING DEVICE AND METHOD

(75) Inventors: Owen Fay, Meridian, ID (US); Xiao Li, Boise, ID (US); Josh Woodland, Kuna, ID (US); Shijian Luo, Boise, ID (US); Jaspreet Gandhi, Boise, ID (US); Te-Sung Wu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 233 days.

(21) Appl. No.: 12/787,187

(22) Filed: May 25, 2010

(65) Prior Publication Data

US 2011/0291146 A1    Dec. 1, 2011

(51) Int. Cl.
*H01L 33/48* (2010.01)
*H01L 23/12* (2006.01)
*B23K 1/20* (2006.01)

(52) U.S. Cl.
USPC .......... 438/455; 438/26; 228/123.1; 228/193; 257/E21.505; 257/E21.51; 257/E33.055

(58) Field of Classification Search
USPC ....... 257/79–103, E21.505, E21.51, E33.055; 438/22–47, 455–459; 228/123.1, 193–195
See application file for complete search history.

(56) References Cited

U.S. PATENT DOCUMENTS

| | | | | |
|---|---|---|---|---|
| 4,921,157 A * | 5/1990 | Dishon et al. | | 228/124.1 |
| 6,092,714 A * | 7/2000 | Casey | | 228/205 |
| 6,221,197 B1 * | 4/2001 | Mori et al. | | 156/308.6 |
| 6,583,514 B2 * | 6/2003 | Tago et al. | | 257/778 |
| 7,380,698 B2 * | 6/2008 | Meyer et al. | | 228/194 |
| 7,390,735 B2 * | 6/2008 | Mehrotra | | 438/615 |
| 7,781,755 B2 * | 8/2010 | Sung et al. | | 257/13 |
| 7,910,945 B2 * | 3/2011 | Donofrio et al. | | 257/99 |
| 2007/0205253 A1 * | 9/2007 | Hubner | | 228/193 |
| 2008/0003777 A1 * | 1/2008 | Slater et al. | | 438/455 |
| 2009/0242916 A1 * | 10/2009 | Hsu et al. | | 257/98 |

OTHER PUBLICATIONS

Furuno, M., et al., "Flux free flip chip attach technology for BGA/CSP packages", 49th Electronic Components and Technology Conference, 1999. 1999 Proceedings., (1999), 408-414.

Welch, W., et al., "Transient liquid phase (TLP) bonding for microsystem packaging applications", The 13th International Conference on Solid-State Sensors, Actuators and Microsystems, 2005. Digest of Technical Papers. Transducers '05, vol. 2, (2005), 1350-1353.

* cited by examiner

*Primary Examiner* — Robert J Hoffberg
*Assistant Examiner* — Eric Ward
(74) *Attorney, Agent, or Firm* — Schwegman, Lundberg & Woessner, P.A.

(57) ABSTRACT

Methods of forming devices, including LED devices, are described. The devices may include fluorinated compound layers. The methods described may utilize a plasma treatment to form the fluorinated compound layers. The methods described may operate to produce an intermetallic layer that bonds two substrates such as semiconductor wafers together in a relatively efficient and inexpensive manner.

22 Claims, 5 Drawing Sheets

US 8,492,242 B2

DRY FLUX BONDING DEVICE AND METHOD

TECHNICAL FIELD

Various embodiments described herein relate to methods for bonding substrates together, in particular, to form LED devices.

BACKGROUND

LED devices are desirable due to their high energy efficiency. Recent advances have provided high brightness LED devices that open up a number of applications for LED lighting such as roadway lighting, car headlights, etc. LED devices, and particularly high brightness LED devices produce heat along with light. Due to the heat produced, melting temperatures of materials used to produce LED devices should be taken into account. As a result, efficient heat dissipation measures are often used to keep the devices cool and reduce heat related issues.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and chemical, structural, logical, electrical changes, etc. may be made.

The terms wafer and substrate used in the following description include any structure having an exposed surface with which to form a device or integrated circuit (IC) structure. The term substrate is understood to include semiconductor wafers. The term substrate is also used to refer to semiconductor structures during processing, and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

It is desirable to provide a bonding technology for use in forming LED devices that results in devices that can withstand and operate efficiently at high temperatures. It is also desirable that such methods are efficient in production, and low in cost.

Figure 1:
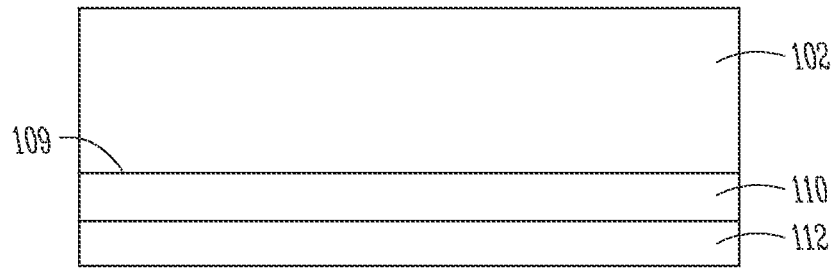
FIG. 1 shows a stage of a bonding operation according to an embodiment of the invention.
Figure 1:
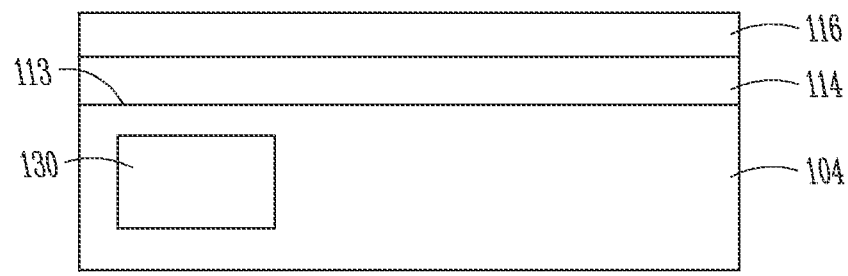

FIG. 1 illustrates a stage of a bonding operation, including a diagram of a device 100 in a stage of manufacturing. The device 100 is formed with a first substrate 102 and a second substrate 104. FIG. 1 shows a stage of manufacturing prior to bonding the first substrate 102 and the second substrate 104 together. FIG. 1 shows an LED 130 in block diagram format, formed on or within the second substrate 104. In one embodiment, the LED 130 includes a high brightness LED 130. High brightness LED devices typically operate in an intensity range of several hundred millicandella. In one embodiment, the LED 130 includes a vertical LED. Vertical LED devices have electrical contacts on either side of the device (such as a top and bottom of a device) in contrast to both electrical contacts being formed on one side of a device. In one example, vertical LEDs are more easily formed using CMOS processes and are suitable for low cost, high volume manufacturing. Although a single LED 130 is shown in block diagram format, multiple LEDs may also be formed on the second substrate 104.

FIG. 1 further illustrates a first metallic layer 110 formed on a surface of the first substrate 102. A second metallic layer 112 is shown over the first metallic layer 110. Similarly on the second substrate 104, a first metallic layer 114 is formed on a surface of the second substrate 104, and a second metallic layer 116 is shown over the first metallic layer 114.

In one example both surfaces of the first substrate 102 and the second substrate 104 are prepared with a first metallic layer and a second metallic layer. In other configurations, only one of the substrates may be coated with a first metallic layer and a second metallic layer.

In one embodiment, first substrate 102 and second substrate 104 may be bonded using a transient liquid phase (TLP) method to form the device 100. When heated, the first metallic layer 110 and the second metallic layer 112 become at least partially liquid, and combine to form an intermetallic compound. The liquid phase wets the surfaces to be bonded, and provides adhesion between the surfaces. The liquid phase further spreads across irregularities in the surfaces between the first substrate 102 and the second substrate 104. As the reaction progresses, and the intermetallic compound is formed, the liquid phases are consumed. The materials of the first metallic layer 110 and the second metallic layer 112 are chosen to at least partially melt at a first temperature (for example, 200 to 300° C.), and produce intermetallic compounds that have a melting temperature higher than either the first metallic layer 110 or the second metallic layer 112. In this way, the bonding takes place at the melting temperature of one or more of the metallic layers, and the formed bond will withstand higher temperatures. This method of transient liquid phase bonding is particularly suited to high operating temperature devices such as high brightness LED devices.

One example of metal materials that can be included in the first metallic layer 110 or the second metallic layer 112 include nickel and tin. In a nickel and tin system, at least one intermetallic compound formed includes $Ni_3Sn_4$. Other metallic layer systems that can be used in selected embodiments include, but are not limited to: tin silver alloys (SnAg) and nickel; copper and tin; copper and tin silver alloys; gold and tin; and platinum and tin.

Surfaces such as the surface of the second metallic layer 112 can become oxidized in air after they are deposited onto a substrate. Because surface oxides such as tin oxides can have relatively high melting temperatures (as high as 1000° C. for some tin oxides), the formation of such oxides can hinder melting of the metallic layers and subsequent formation of the intermetallic compounds. Fluxing a surface to remove oxides is one method of reducing this problem, however liquid or paste fluxes can be difficult to apply and messy to clean up during a manufacturing process. Embodiments described below address this issue.

Figure 2:
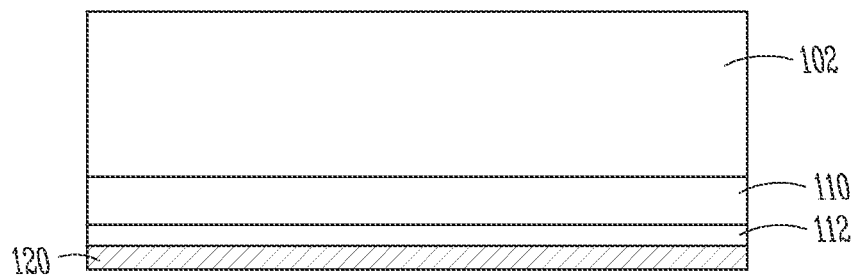
FIG. 2 shows another stage of a bonding operation according to an embodiment of the invention.
Figure 2:
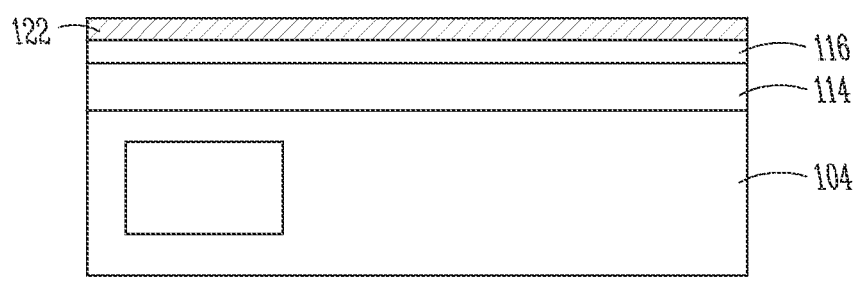

FIG. 2 shows the device 100 in a further stage of processing. A first compound layer 120 and a second compound layer 122 are shown. In one example, the surfaces of the device 100 are exposed to a plasma treatment to form the first compound layer 120 and the second compound layer 122. In one example the plasma treatment includes a fluorine plasma treatment. Examples of fluorine plasma treatment sources include, but are not limited to $CF_4$ and $SF_6$.

Fluorinated metallic and metallic oxide compounds have much lower melting temperatures than surface oxides discussed above, such as tin oxides. For example, fluorinated or oxyfluorinated tin compounds such as $SnF_y$ or $SnO_xF_y$ have melting temperatures that are in a range of metallic tin, which melts at approximately 230° C. Because the first compound layer 120 and second compound layer 122 have melting temperatures closer to the melting temperature of one or more of the first metallic layer 110 and the second metallic layer 112 removing surface oxides with liquid or paste flux is not required. Adding a plasma step to a fabrication line such as a complementary metal oxide semiconductor (CMOS) fabrication line is relatively easy, and with a plasma treatment, there is no excess flux to clean from the substrates in process.

In one example, one or both of the first metallic layer 110 and the second metallic layer 112 are exposed to an oxygen source to form a metal oxide prior to exposure to a fluorine plasma treatment source as described above. In one example, the oxygen source includes an oxygen plasma source. Although native oxides are often present on metallic surfaces due to their presence in air, in selected examples, further oxidation prior to fluorine plasma treatment is used to control an oxyfluorinated metal chemistry.

Figure 3:
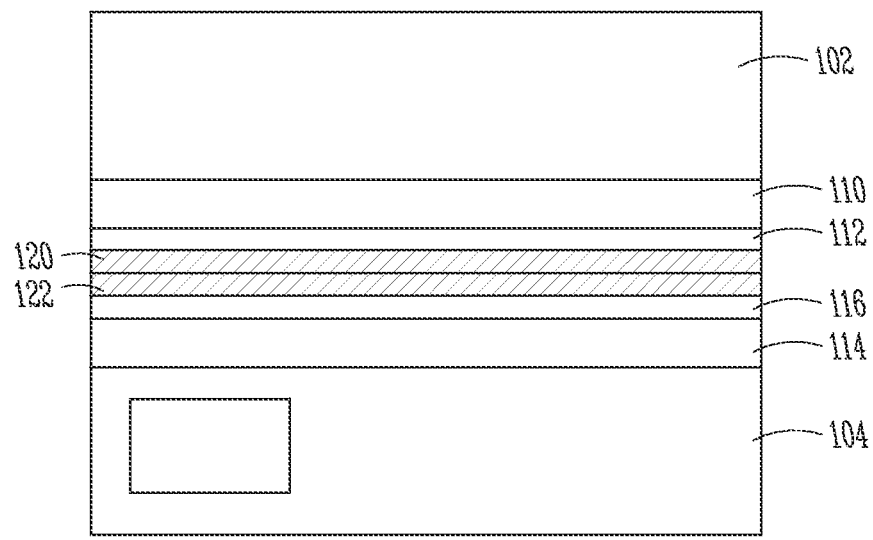
FIG. 3 shows another stage of a bonding operation according to an embodiment of the invention.

FIG. 3 shows a further stage of a process of manufacturing the device 100. The first substrate 102 and the second substrate 104 are brought into contact, with the first compound layer 120 and the second compound layer 122 contacting one another or in close proximity to one another. As discussed above, although both surfaces are shown with compound layers 120, 122 formed on them, in other embodiments only one of the surfaces is coated. In such an example the opposing uncoated substrate may be passivated by other techniques such as gold coating, etc. One drawback of passivation by gold coating or other noble metals is the expense of such materials.

Figure 4:
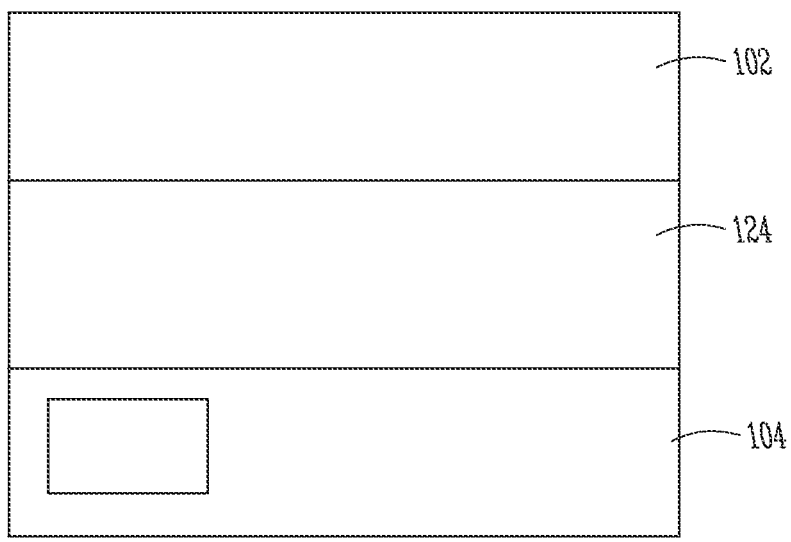
FIG. 4 shows another stage of a bonding operation according to an embodiment of the invention.

FIG. 4 shows a further stage of a process of manufacturing the device 100. Here the first metallic layer 110 and the second metallic layer 112, the first metallic layer 114 and the second metallic layer 116, and the first compound layer 120 and the second compound layer 122 are at least partially melted, and transformed into an intermetallic layer 124. As noted above, in a nickel-tin system, the intermetallic layer will be predominantly $Ni_3Sn_4$. As discussed above, the intermetallic layer 124 provides a bond between the first substrate 102 and the second substrate 104, and the prior liquid phase provides surface wetting and conformal coverage of surface irregularities.

In one embodiment, a ratio of thicknesses of the second metallic layer 112 to the first metallic layer 110 is specified. Because material from the first metallic layer 110 and the second metallic layer 112 are consumed to form the intermetallic layer 124, the amounts of each layer provided can affect chemistry of the intermetallic layer 124. In some embodiments, due to intermetallic chemistry, a ratio of thicknesses of the second metallic layer 112 to the first metallic layer 110 can affect an amount of unconverted material left over after a reaction.

In one example where the first metallic layer 110 includes nickel, and the second metallic layer 112 includes tin, a ratio of tin to nickel is not greater than 3.5 to 1. In another example, the first metallic layer 110 is nickel, and the second metallic layer 112 is AgSn, a ratio of AgSn to nickel is not greater than 3.5 to 1.

In one example, a ratio of thickness is about 1 to 1. For example the first metallic layer 110 has a thickness of 1μ of nickel, and the second metallic layer 112 has a thickness of 1μ of tin. In another example, the first metallic layer 110 has a thickness of 0.4μ of nickel, and the second metallic layer 112 has a thickness of 0.6μ of AgSn. In one example the thicknesses of both the first metallic layer 110 and the second metallic layer 112 are greater than 0.5μ in order to form a sufficient thickness to compensate for irregularities in substrate surfaces and/or substrate warpage.

In one example a barrier material may be further included between the substrates 102, 104 and the first metallic layers 110, 114 respectively. An example of a barrier material includes, but is not limited to titanium, or a titanium tungsten alloy, etc. The addition of a barrier layer may prevent mixing of the substrate material (such as silicon) with the intermetallic layer 124.

An advantage of using plasma process described above includes a more reliable substantially void free bond line. Liquid fluxing can leave droplets of flux behind that may cause voids. Also a relatively thick intermetallic layer 124 is useful to prevent or minimize voids at the bond line. When voids are present at the bond line, heat dissipation is diminished, and LED device performance is reduced.

In one example during the bonding process and formation of the intermetallic layer 124, pressure is applied to hold the interface between the first substrate 102 and the second substrate 104 together. An advantage of adding pressure to the process includes better formation of a substantially void free bond line. In one example, pressure in a range between 0.1 MPa and 10 MPa is applied during the heating and formation of the intermetallic layer 124. In one example the pressure applied is approximately 1.0 MPa at a temperature of approximately 300° C. for approximately 6 minutes, using nickel as a first metallic layer, and tin or a tin alloy as a second metallic layer.

Figure 5:
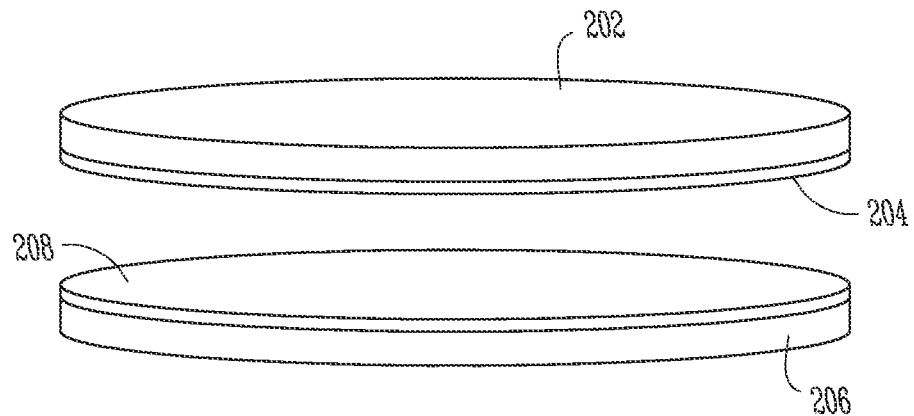
FIG. 5 shows a stage of a wafer bonding operation according to an embodiment of the invention.

FIG. 5 shows wafer level bonding using methods described above. A first wafer 202 is shown with a second wafer 206. The first wafer includes layers of metal 204, including a first metallic layer and a second metallic layer similar to embodiments described above. The layers of metal 204 in FIG. 5 have further been plasma treated to form a fluorinated compound layer on the last exposed metallic layer as described in embodiments above. Likewise the second wafer 206 is shown with layers of metal 208 that include a first metallic layer, a second metallic layer, and a fluorinated compound layer.

Figure 6:
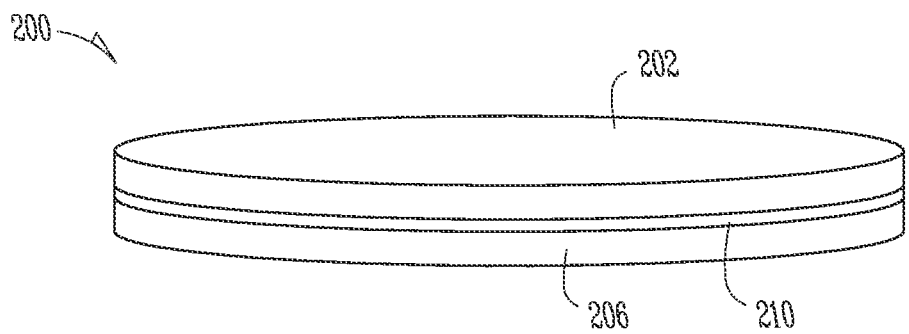
FIG. 6 shows another stage of a wafer bonding operation according to an embodiment of the invention.

FIG. 6 shows the first wafer 202 bonded to the second wafer 206 with an intermetallic layer 210 formed therebetween. In one embodiment, one of the wafers, 202 or 206 includes one or more LEDs. The combination of the first wafer 202 bonded to the second wafer 206 with one or more LEDs forms an LED device 200. In one example, the LED device 200 is diced or otherwise subdivided into another final shape other than wafer shaped. An advantage of the plasma processing for bonding as described above includes the ability to treat relatively large surface areas, and to bond them together without removing excess liquid or paste flux. The ability to reliably and efficiently bond large surfaces such as wafer level greatly improves manufacturing efficiency and reduces cost.

Figure 7:
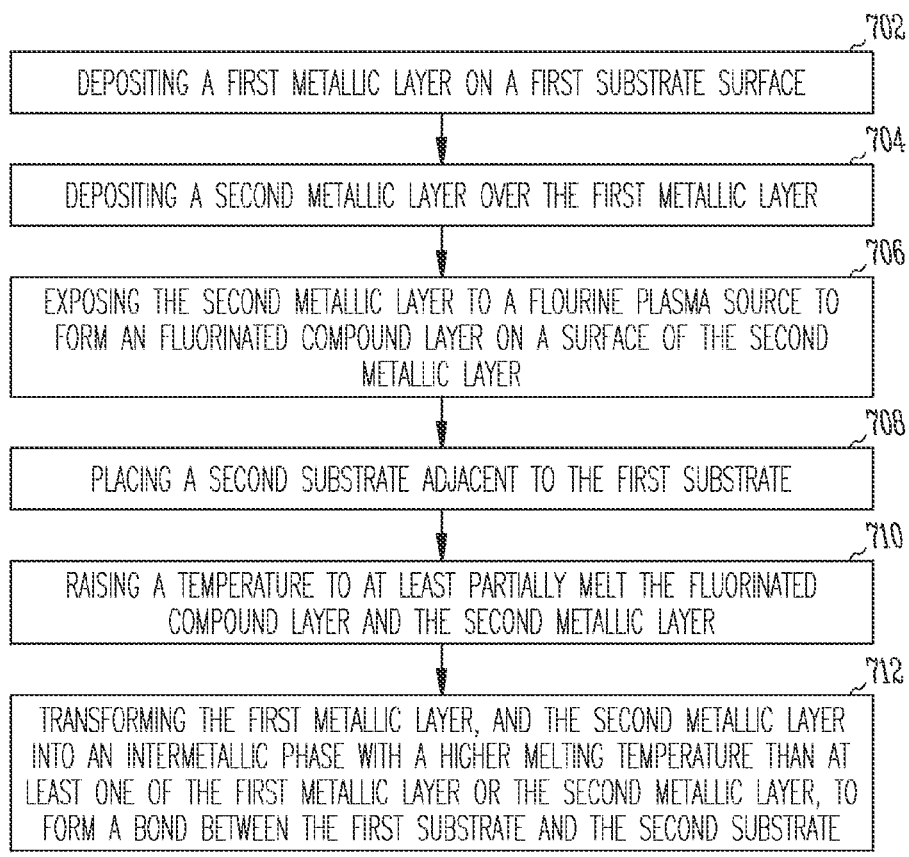
FIG. 7 shows a method of bonding according to an embodiment of the invention.

FIG. 7 illustrates an example process flow for bonding using a plasma treatment similar to embodiments described above. In operation 702, a first metallic layer is deposited on a first substrate surface. One example of a first substrate surface includes a wafer, as described above. In operation 704, a second metallic layer is deposited over the first metallic layer. Examples include a first metallic layer of nickel, and a second metallic layer of tin or a tin alloy, as discussed in embodiments above.

In operation 706, the second metallic layer is exposed to a fluorine plasma source to form a fluorinated compound layer on a surface of the second metallic layer. As discussed in embodiments above, examples of fluorinated compound layers include metal fluorine compounds and metal oxyfluorine compounds.

In operation 708, a second substrate including one or more LED devices is placed adjacent to the first substrate. In one example the second substrate includes a wafer of substantially the same diameter as a first substrate wafer. In operation 710, a temperature in a processing chamber is raised, and the fluorinated compound layer and at least the second metal layer are partially or completely melted. In operation 712, the layers are transformed into an intermetallic phase with a higher melting temperature than the first metallic layer, or the second metallic layer, to form a bond between the first substrate and the second substrate. As discussed above, bonding takes place at relatively low melting temperatures of one or more of the metallic layers, and the resulting intermetallic bond will withstand higher temperatures. The bonding techniques described, are particularly suited to high operating temperature devices such as high brightness LED devices.

Figure 8:
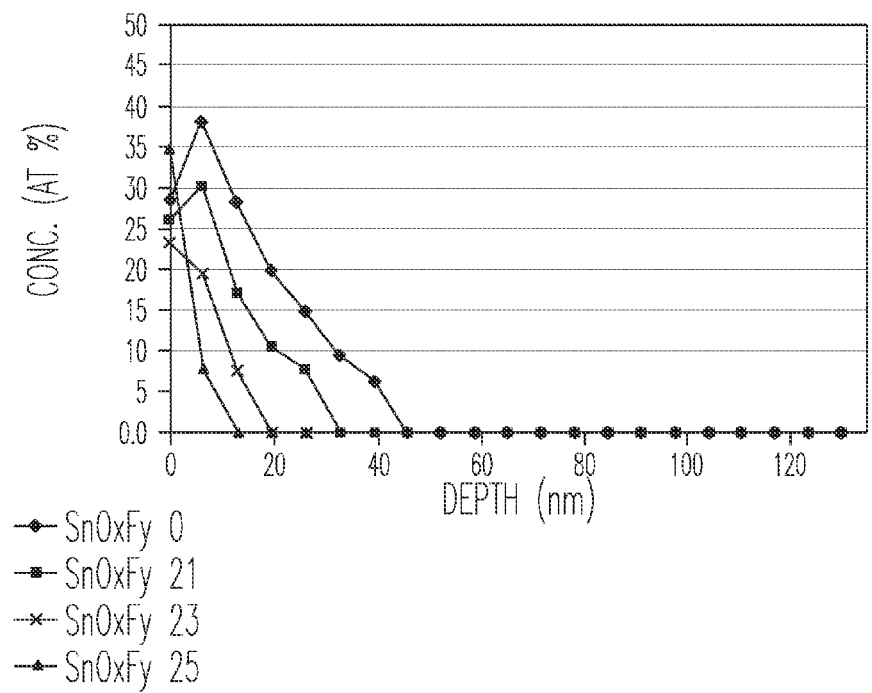
FIG. 8 shows a concentration versus depth profile of $SnO_xF_y$ after 5 days in air according to an embodiment of the invention.
Figure 9:
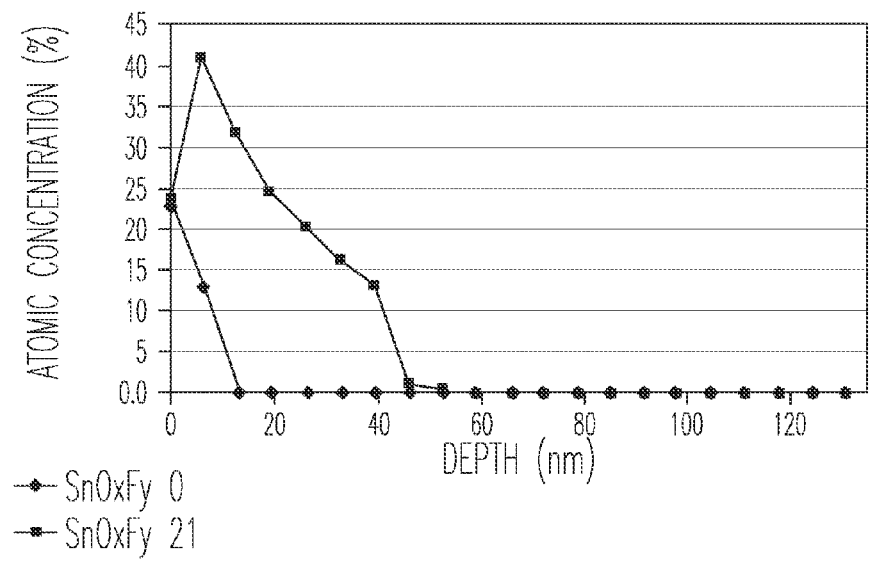
FIG. 9 shows a concentration versus depth profile of $SnO_xF_y$ after 26 days in air according to an embodiment of the invention.

FIGS. 8 and 9 show X-ray photoelectron spectroscopy (XPS) data regarding thickness of a fluorinated compound layer as described in examples above. The example fluorinated compound layer shown in FIGS. 8 and 9 comprises an $SnO_xF_y$ compound. FIG. 8 illustrates a thickness of approximately 45 nm five days after formation of the compound layer. FIG. 9 illustrates substantially no change in the thickness of approximately 45 nm twenty-six days after formation of the compound layer. FIGS. 8 and 9 illustrate that within at least a working range of a few weeks that the fluorinated compound layer is relatively stable in air, and that after plasma treatment, the components (e.g., a treated wafer) can be stored temporarily in air without significantly altering their effectiveness at forming a intermetallic bond as described in embodiments above.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A method, comprising:
   depositing a first metallic layer on a first substrate surface;
   depositing a second metallic layer over the first metallic layer;
   exposing the second metallic layer to an oxygen source to form a metal oxide having a thickness greater than a native oxide, and exposing the metal oxide to a fluorine plasma source to form an oxyfluorinated compound layer on a surface of the second metallic layer;
   placing a second substrate adjacent to the first substrate;
   raising a temperature to at least partially melt the oxyfluorinated compound layer and the second metallic layer; and
   transforming the first metallic layer, and the second metallic layer into an intermetallic phase with a higher melting temperature than at least one of the first metallic layer or the second metallic layer, to form a bond between the first substrate and the second substrate.

2. The method of claim 1, wherein depositing the first metallic layer includes depositing nickel and depositing the second metallic layer includes depositing tin.

3. The method of claim 1, wherein depositing the first metallic layer includes depositing nickel and depositing the second metallic layer includes depositing a tin silver alloy.

4. The method of claim 1, wherein depositing the first metallic layer includes depositing copper and depositing the second metallic layer includes depositing tin.

5. The method of claim 1, wherein depositing the first metallic layer includes depositing copper and depositing the second metallic layer includes depositing a tin silver alloy.

6. The method of claim 1, wherein depositing the first metallic layer includes depositing gold and depositing the second metallic layer includes depositing tin.

7. The method of claim 1, wherein depositing the first metallic layer includes depositing platinum and depositing the second metallic layer includes depositing tin.

8. The method of claim 1, wherein placing the second substrate adjacent to the first substrate includes placing a wafer including one or more LED devices adjacent to another wafer.

9. A method, comprising:
   depositing a first metallic layer on a first substrate surface;
   depositing a second metallic layer over the first metallic layer;
   exposing the second metallic layer to an oxygen plasma source to form an oxide compound layer having a thickness greater than a native oxide on a surface of the second metallic layer;
   exposing the oxide compound layer to a fluorine plasma source to form an oxyfluorinated compound layer on a surface of the second metallic layer;
   placing a second substrate including one or more LED devices adjacent to the first substrate;

raising a temperature to at least partially melt the fluorinated compound layer and the second metallic layer; and transforming the first metallic layer and the second metallic layer into an intermetallic phase with a higher melting temperature than at least one of the first metallic layer, or the second metallic layer, to form a bond between the first substrate and the second substrate.

10. The method of claim 9, wherein exposing the oxide compound layer to a fluorine plasma source includes exposing the oxide compound layer to a $CF_4$ plasma source.

11. The method of claim 9, wherein exposing the oxide compound layer to a fluorine plasma source includes exposing the oxide compound layer to a $SF_6$ plasma source.

12. The method of claim 9, wherein depositing the second metallic layer includes depositing tin.

13. The method of claim 9, wherein depositing the second metallic layer includes depositing a tin alloy.

14. The method of claim 13, wherein depositing the second metallic layer includes depositing a tin silver alloy.

15. A method, comprising:

depositing first metallic layers on a first substrate surface and on a second substrate, the second substrate including a vertical LED device;

depositing second metallic layers over the first metallic layers;

exposing the second metallic layers to an oxygen source to form a metal oxide having a thickness greater than a native oxide, and exposing the metal oxide to a fluorine plasma source to form oxyfluorinated compound layers on surfaces of the second metallic layers;

placing the oxyfluorinated compound layer of the first substrate into contact with the oxyfluorinated compound layer of the second substrate;

raising a temperature to at least partially melt the oxyfluorinated compound layers and the second metallic layers; and transforming the first metallic layer, and the second metallic layer into an intermetallic phase with a higher melting temperature than at least one of the first metallic layer, or the second metallic layer, to form a bond between the first substrate and the second substrate.

16. The method of claim 15, wherein depositing first metallic layers on the second substrate include depositing first metallic layers on a second substrate that includes a high brightness LED device.

17. The method of claim 15, wherein depositing first metallic layers includes depositing nickel layers, and depositing second metallic layers includes depositing tin containing layers.

18. The method of claim 17, wherein depositing nickel layers and depositing tin containing layers includes depositing layers to form a thickness ratio of tin containing layers to nickel layers that is not greater than 3.5 to 1.

19. The method of claim 18, wherein depositing nickel layers and depositing tin containing layers includes depositing nickel layers greater than 0.5 μm thick, and depositing tin containing layers greater than 0.5 μm thick.

20. The method of claim 15, wherein depositing first metallic layers includes depositing 1 μm thick nickel layers, and depositing second metallic layers includes depositing 1 μm thick tin layers.

21. The method of claim 15, wherein depositing first metallic layers includes depositing 0.4 μm thick nickel layers, and depositing second metallic layers includes depositing 0.6 μm thick SnAg layers.

22. The method of claim 15, further including applying pressure to the first substrate and the second substrate in a range of approximately 0.1 MPa to 10 MPa during the intermetallic phase transformation.

* * * * *